United States Patent
Lee et al.

(10) Patent No.: US 9,099,607 B2
(45) Date of Patent: Aug. 4, 2015

(54) SOLAR CELL

(75) Inventors: Hyunho Lee, Seoul (KR); Junyong Ahn, Seoul (KR); Jiweon Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 565 days.

(21) Appl. No.: 13/034,536

(22) Filed: Feb. 24, 2011

(65) Prior Publication Data

US 2012/0048362 A1   Mar. 1, 2012

(30) Foreign Application Priority Data

Aug. 25, 2010 (KR) .................. 10-2010-0082389

(51) Int. Cl.
*H01L 31/00* (2006.01)
*H01L 31/18* (2006.01)
*H01L 31/0216* (2014.01)
*H01L 31/0236* (2006.01)
*H01L 31/068* (2012.01)

(52) U.S. Cl.
CPC ...... *H01L 31/1804* (2013.01); *H01L 31/02168* (2013.01); *H01L 31/02366* (2013.01); *H01L 31/068* (2013.01); *Y02E 10/52* (2013.01); *Y02E 10/547* (2013.01)

(58) Field of Classification Search
CPC .................. H01L 31/02168; H01L 31/02366
USPC ........................... 136/246, 251, 256
See application file for complete search history.

(56) References Cited

U.S. PATENT DOCUMENTS

| | | | | |
|---|---|---|---|---|
| 5,472,885 A | * | 12/1995 | Matsuno et al. | 438/72 |
| 5,629,534 A | * | 5/1997 | Inuzuka et al. | 257/84 |
| 5,871,591 A | * | 2/1999 | Ruby et al. | 136/261 |
| 6,552,414 B1 | * | 4/2003 | Horzel et al. | 257/655 |
| 2001/0031109 A1 | * | 10/2001 | Paniccia et al. | 385/14 |
| 2004/0112426 A1 | * | 6/2004 | Hagino | 136/261 |
| 2005/0126627 A1 | * | 6/2005 | Hayashida | 136/257 |
| 2007/0113881 A1 | * | 5/2007 | Mellott et al. | 136/243 |
| 2008/0092944 A1 | * | 4/2008 | Rubin | 136/252 |
| 2009/0260681 A1 | * | 10/2009 | Yun et al. | 136/256 |
| 2009/0260684 A1 | * | 10/2009 | You | 136/256 |
| 2009/0288702 A1 | * | 11/2009 | Kim et al. | 136/251 |
| 2010/0018565 A1 | * | 1/2010 | Funakoshi | 136/244 |

FOREIGN PATENT DOCUMENTS

| | | |
|---|---|---|
| JP | 2002-164555 A | 6/2002 |
| KR | 10-2005-0087248 A | 8/2005 |
| KR | 10-2009-0091562 A | 8/2009 |

* cited by examiner

*Primary Examiner* — Eli Mekhlin
(74) *Attorney, Agent, or Firm* — Birch, Stewart, Kolasch & Birch, LLP (57) ABSTRACT

A solar cell is discussed. The solar cell according to an embodiment includes a substrate of a first conductive type, an emitter layer of a second conductive type opposite the first conductive type, which forms a p-n junction along with the substrate, a first anti-reflection layer on the emitter layer, a second anti-reflection layer on the first anti-reflection layer, a first electrode part connected to the emitter layer, and a second electrode part connected to the substrate. The first anti-reflection layer is formed of silicon nitride, and the second anti-reflection layer is formed of silicon oxide.

4 Claims, 4 Drawing Sheets

SOLAR CELL

This application claims priority to and the benefit of Korean Patent Application No. 10-2010-0082389 filed in the Korean Intellectual Property Office on Aug. 25, 2010, the entire contents of which are incorporated herein by reference.

BACKGROUND OF THE INVENTION

1. Field of the Invention

Embodiments of the invention relate to a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor part and the separated holes move to the p-type semiconductor part, and then the electrons and holes are collected by the electrodes electrically connected to the n-type semiconductor part and the p-type semiconductor part, respectively. The electrodes are connected to each other using electric wires to thereby obtain electric power.

SUMMARY OF THE INVENTION

In one aspect, there is a solar cell including a semiconductor substrate of a first conductive type, an emitter layer of a second conductive type opposite the first conductive type, the emitter layer configured to form a p-n junction along with the semiconductor substrate, a first anti-reflection layer positioned on the emitter layer, the first anti-reflection layer having a refractive index of about 2.05 to 2.15 and a thickness of about 65 nm to 95 nm, a second anti-reflection layer positioned on the first anti-reflection layer, the second anti-reflection layer having a refractive index of about 1.5 to 1.7 and a thickness of about 80 nm to 110 nm, a first electrode part connected to the emitter layer, and a second electrode part connected to the semiconductor substrate.

The emitter layer may include a first emitter region and a second emitter region each having a different impurity doping thickness. The first electrode part may adjoin the first emitter region, and the first anti-reflection layer may adjoin the second emitter region.

An impurity doping thickness of the first emitter region may be greater than an impurity doping thickness of the second emitter region. A sheet resistance of the first emitter region may be less than a sheet resistance of the second emitter region.

A shortest distance between a surface of the semiconductor substrate and a p-n junction surface between the first emitter region and the semiconductor substrate may be longer than a shortest distance between the surface of the semiconductor substrate and a p-n junction surface between the second emitter region and the semiconductor substrate.

The semiconductor substrate may be a single crystal silicon substrate. The semiconductor substrate may have a textured surface.

The first anti-reflection layer may be formed of silicon nitride, and the second anti-reflection layer may be formed of silicon oxide.

In another aspect, there is a solar cell including a semiconductor substrate of a first conductive type; an emitter layer of a second conductive type opposite the first conductive type, the emitter layer configured to form a p-n junction along with the semiconductor substrate, and having a first part and a second part with different impurity thicknesses; a first anti-reflection layer positioned on the emitter layer, the first anti-reflection layer being formed of silicon nitride, the first anti-reflection layer having a first refractive index and a first thickness; a second anti-reflection layer positioned on the first anti-reflection layer, the second anti-reflection layer being formed of silicon oxide, the second anti-reflection layer having a second refractive index and a second thickness; a first electrode part connected to the emitter layer, and having a first portion and a second portion; and a second electrode part connected to the semiconductor substrate, wherein the second refractive index is greater than the first refractive index, and the second thickness is greater than the first thickness.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 1:
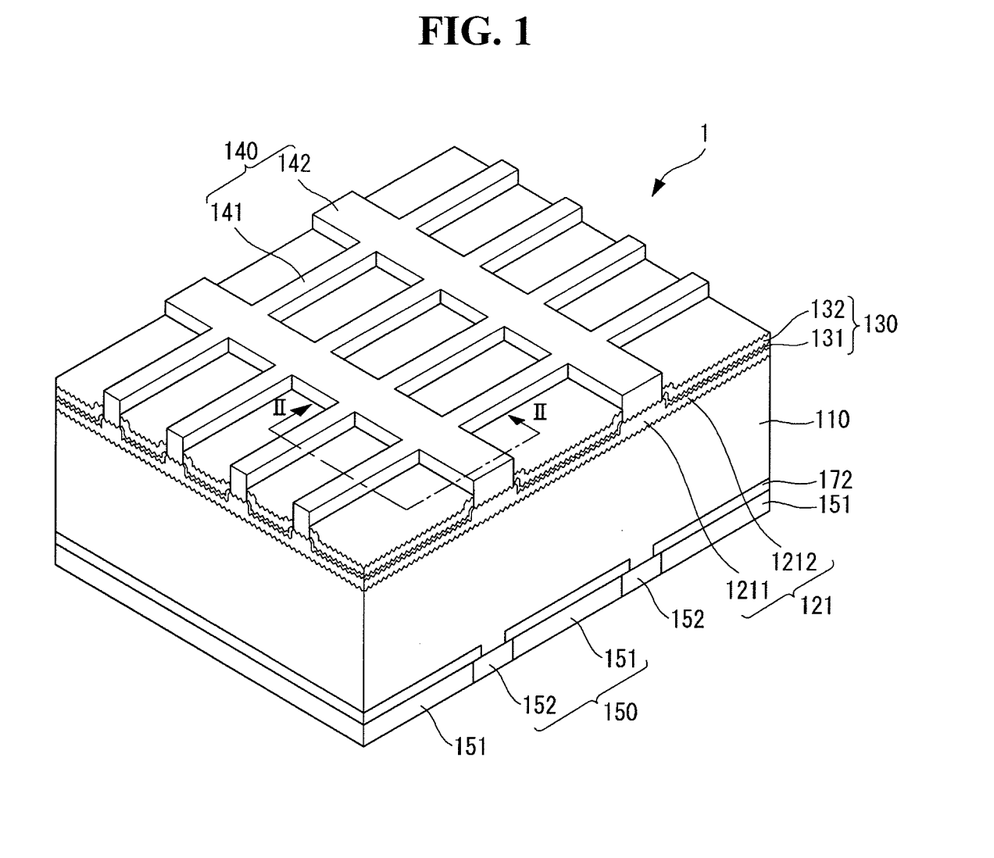
FIG. 1 is a partial perspective view of a solar cell according to an example embodiment of the invention.
Figure 2:
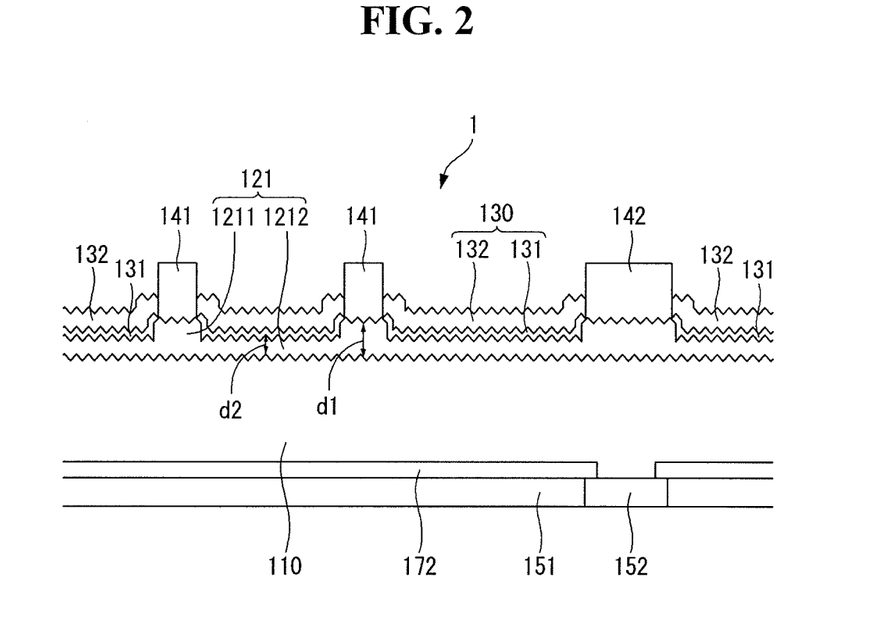
FIG. 2 is a cross-sectional view taken along line II-II of FIG. 1.

FIG. 1 is a partial perspective view of a solar cell according to an example embodiment of the invention. FIG. 2 is a cross-sectional view taken along line II—II of FIG. 1.

As shown in FIGS. 1 and 2, a solar cell 1 according to an example embodiment of the invention includes a substrate 110, an emitter layer 121 positioned at an incident surface (hereinafter, referred to as "a front surface") of the substrate 110 on which light is incident, an anti-reflection layer 130 positioned on the emitter layer 121, a front electrode part 140 connected to the emitter layer 121, a back surface field layer 172 positioned at a surface (hereinafter, referred to as "a back surface"), opposite the front surface of the substrate 110, on which light is not incident, and a back electrode part 150 positioned on the back surface of the substrate 110.

The substrate 110 is a semiconductor substrate formed of single crystal silicon of a first conductive type, for example, p-type, though not required. When the substrate 110 is of the p-type, the substrate 110 may be doped with impurities of a group III element such as boron (B), gallium (Ga), and indium (In). Alternatively, the substrate 110 may be of an n-type. When the substrate 110 is of the n-type, the substrate 110 may be doped with impurities of a group V element such as phosphorus (P), arsenic (As), and antimony (Sb).

The front surface of the substrate 110 is textured to form a textured surface corresponding to an uneven surface or having uneven characteristics. FIG. 1 shows that only an edge of the substrate 110 and only an edge of the anti-reflection layer 130 on the substrate 110 have a plurality of uneven portions for the sake of brevity. However, the entire front surface of the substrate 110 is the textured surface having the plurality of uneven portions, and thus the anti-reflection layer 130 on the front surface of the substrate 110 has the textured surface having the plurality of uneven portions.

In this instance, the textured surface may be formed using an alkaline solution. The plurality of uneven portions may have nonuniform widths and nonuniform heights within the range of several tens of $\mu m$.

Light incident on the front surface of the substrate 110 is reflected several times by the anti-reflection layer 130 and the textured surface of the substrate 110 having the plurality of uneven portions and is incident to the inside of the substrate 110. Hence, an amount of light reflected from the front surface of the substrate 110 decreases, and an amount of light incident to the inside of the substrate 110 increases. Further, the surface area of the substrate 110 and the surface area of the anti-reflection layer 130 increase because of the textured surface of the substrate 110. As a result, an amount of light incident on the substrate 110 increases.

The emitter layer 121 is a region obtained by doping the substrate 110 with impurities of a second conductive type (for example, n-type) opposite the first conductive type (for example, p-type) of the substrate 110, so as to be an n-type semiconductor, for example. The emitter layer 121 is positioned at the front surface of the substrate 110 on which light is incident. The emitter layer 121 of the second conductive type forms a p-n junction along with a first conductive type region of the substrate 110. The emitter layer 121 includes a first emitter region 1211 and a second emitter region 1212 each having a different impurity doping thickness (i.e., a different impurity doping concentration).

In the example embodiment of the invention, an impurity doping thickness of the first emitter region 1211 is greater than an impurity doping thickness of the second emitter region 1212. Namely, an impurity doping concentration of the first emitter region 1211 is greater than an impurity doping concentration of the second emitter region 1212. For example, the first emitter region 1211 may have a thickness of about 400 nm to 700 nm from the surface of the substrate 110, and the second emitter region 1212 may have a thickness of about 200 nm to 500 nm from the surface of the substrate 110.

As above, because the impurity doping thicknesses of the first and second emitter regions 1211 and 1212 are different from each other, a distance between a surface (a contact surface between a front electrode 141 and the first emitter region 1211) of the substrate 110 and a p-n junction surface (hereinafter, referred to as "a first junction surface") between the first emitter region 1211 and the substrate 110 is different from a distance between a surface (a contact surface between the anti-reflection layer 130 and the second emitter region 1212) of the substrate 110 and a p-n junction surface (hereinafter, referred to as "a second junction surface") between the second emitter region 1212 and the substrate 110. In other words, as shown in FIGS. 1 and 2, a shortest distance d1 between the surface of the substrate 110 and the first junction surface is longer than a shortest distance d2 between the surface of the substrate 110 and the second junction surface. In view of the contact surface between a front electrode 141 and the first emitter region 1211, the contact surface is located higher than the first anti-reflection layer 131 relative to the surface of the substrate 110.

Further, the first junction surface and the second junction surface are coplanar based on the substrate 110. Therefore, a first shortest distance between the back surface of the substrate 110 and the first junction surface is substantially equal to a second shortest distance between the back surface of the substrate 110 and the second junction surface. In this instance, the first shortest distance and the second shortest distance are substantially equal to each other within the margin of error obtained by a difference between the heights of the uneven portions of the textured surface of the substrate 110.

Sheet resistances of the first and second emitter regions 1211 and 1212 are different from each other because of a difference between the impurity doping thicknesses of the first and second emitter regions 1211 and 1212. In general, the sheet resistance is inversely proportional to an impurity doping thickness. Therefore, in the example embodiment of the invention, because the impurity doping thickness of the first emitter region 1211 is greater than the impurity doping thickness of the second emitter region 1212, the sheet resistance of the first emitter region 1211 is less than the sheet resistance of the second emitter region 1212. For example, the sheet resistance of the first emitter region 1211 may be approximately 30 $\Omega$/sq. to 70 $\Omega$/sq., and the sheet resistance of the second emitter region 1212 may be approximately 80 $\Omega$/sq. to 150 $\Omega$/sq.

The sheet resistance of the emitter layer 121 may be determined in consideration of a loss amount of current in a p-n junction portion and a contact resistance between the emitter layer 121 and the front electrode part 140.

Because the emitter layer 121 is formed using impurities diffused into the substrate 110, a junction surface between the substrate 110 and the emitter layer 121 is not a flat surface but an uneven surface because of the textured surface of the substrate 110.

A plurality of electron-hole pairs produced by light incident on the substrate 110 are separated into electrons and holes by a built-in potential difference resulting from the p-n junction between the substrate 110 and the emitter layer 121. Then, the separated electrons move to the n-type semiconductor, and the separated holes move to the p-type semiconductor. Thus, when the substrate 110 is of the p-type and the emitter layer 121 is of the n-type, the separated holes move to the back surface of the substrate 110 and the separated electrons move to the emitter layer 121.

Because the emitter layer 121 forms the p-n junction along with the substrate 110 (i.e., a first conductive portion of the substrate 110), the emitter layer 121 may be of the p-type when the substrate 110 is of the n-type unlike the example embodiment described above. In this instance, the separated electrons move to the back surface of the substrate 110 and the separated holes move to the emitter layer 121.

Returning to the example embodiment of the invention, when the emitter layer 121 is of the n-type, the emitter layer 121 may be formed by doping the substrate 110 with impurities of a group V element such as P, As, and Sb. On the contrary, when the emitter layer 121 is of the p-type, the emitter layer 121 may be formed by doping the substrate 110 with impurities of a group III element such as B, Ga, and In.

The anti-reflection layer 130 includes a first anti-reflection layer 131 positioned on the emitter layer 121 and a second anti-reflection layer 132 positioned on the first anti-reflection layer 131. The first and second anti-reflection layers 131 and 132 are partially positioned on the first emitter region 1211 and are mostly positioned on the second emitter region 1212.

In the embodiment of the invention, the first anti-reflection layer 131 is formed of silicon nitride (SiNx:H), and the second anti-reflection layer 132 is formed of silicon oxide (SiOx:H).

The first anti-reflection layer 131 mostly performs a passivation function that converts a defect, for example, dangling bonds existing at and around the surface of the substrate 110 into stable bonds to thereby prevent or reduce a recombination and/or a disappearance of carriers moving to the surface of the substrate 110. Hence, the first anti-reflection layer 131 reduces an amount of carriers lost by the defect at the surface of the substrate 110.

The second anti-reflection layer 132 mostly performs an anti-reflection function of light and prevents hydrogen (H) contained in the first anti-reflection layer 131 underlying the second anti-reflection layer 132 from moving upward. Further, because hydrogen (H) contained in silicon oxide (SiOx:H) forming the second anti-reflection layer 132 contributes to the passivation function, the second anti-reflection layer 132 further improves passivation efficiency.

Each of the first and second anti-reflection layers 131 and 132 positioned on the textured surface of the substrate 110 has a textured surface having a plurality of uneven portions in the same manner as the substrate 110. Because the first and second anti-reflection layers 131 and 132 are sequentially positioned on the textured surface of the substrate 110, widths and heights of the plurality of uneven portions of each of the first and second anti-reflection layers 131 and 132 are almost similar to or greater than the widths and the heights of the plurality of uneven portions of the substrate 110.

As described above, because the widths and the heights of the plurality of uneven portions of the substrate 110 are within the range of several tens of the widths and the heights of the plurality of uneven portions of each of the first and second anti-reflection layers 131 and 132 are within the range of several tens of μm. Light incident on the second and first anti-reflection layers 132 and 131 from the outside is reflected several times by the plurality of uneven portions of the second and first anti-reflection layers 132 and 131 and then is incident to the inside of the substrate 110.

Further, when light is incident on the second anti-reflection layer 132, the light may collide with (or be incident on) the second anti-reflection layer 132 and then may be reflected from the second anti-reflection layer 132. However, even in this instance, because the second anti-reflection layer 132 is formed of silicon oxide (SiOx:H), the light is not absorbed in the second anti-reflection layer 132. On the other hand, because the first anti-reflection layer 131 is formed of silicon nitride (SiNx:H), light is absorbed in the first anti-reflection layer 131 every time the light collides with (or is incident on) the first anti-reflection layer 131.

Light incident on the front surface of the substrate 110 collides with (or is incident on) the first anti-reflection layer 131 several times because of the textured front surface of the substrate 110 and is reflected from the first anti-reflection layer 131 several times. Then, the light is incident to the inside of the substrate 110. Every time the light incident to the inside of the substrate 110 collides with (or is incident on) the uneven surface of the first anti-reflection layer 131, the light is absorbed in the first anti-reflection layer 131. As a result, an amount of light incident to the inside of the substrate 110 decreases.

Accordingly, to address the above issue, a refractive index and a thickness of the second anti-reflection layer 132 are determined to a value capable of minimizing the reflection of light. A refractive index and a thickness of the first anti-reflection layer 131 are determined to a value capable of minimizing an absorption amount of light generated when the light is reflected from first anti-reflection layer 131 several times.

A parameter of a layer affecting an absorption operation of light is generally a refractive index and a thickness. An influence of the refractive index on the absorption operation is approximately 70%, and an influence of the thickness on the absorption operation is approximately 30%. Because an influence of the refractive index on a reflectance of the layer is greater than an influence of the thickness on the reflectance of the layer, an optimum refractive index suitable for the operation of each of the first and second anti-reflection layers 131 and 132 is determined, and then an optimum thickness of each of the first and second anti-reflection layers 131 and 132 is determined.

In the example embodiment of the invention, the first anti-reflection layer 131 may have a refractive index of about 2.05 to 2.15 and a thickness of about 65 nm to 95 nm. The second anti-reflection layer 132 may have a refractive index of about 1.5 to 1.7 and a thickness of about 80 nm to 110 nm.

Accordingly, in the example embodiment of the invention, the total thickness of the anti-reflection layer 130 may be approximately 145 nm to 205 nm, and the refractive index of the second anti-reflection layer 132 may be less than the refractive index of the first anti-reflection layer 131.

When the refractive index of the first anti-reflection layer 131 is greater than about 2.15, an amount of light absorbed in the first anti-reflection layer 131 further increases. When the refractive index of the first anti-reflection layer 131 is less than about 2.05, a light reflectance of the first anti-reflection layer 131 further increases. Further, when the thickness of the first anti-reflection layer 131 is out of the above thickness range, the light reflectance of the first anti-reflection layer 131 further increases.

When the thickness of the second anti-reflection layer 132 is less than about 80 nm, a light reflectance of the second anti-reflection layer 132 further increases. When the thickness of the second anti-reflection layer 132 is greater than about 110 nm, the second anti-reflection layer 132 adversely affects a connection between the front electrode part 140 and the emitter layer 121 in a fabrication process of the solar cell 1. Hence, it may be difficult to perform a stable contact between the front electrode part 140 and the emitter layer 121.

As described above, in the example embodiment of the invention, the emitter layer 121 has a selective emitter structure including the first and second emitter regions 1211 and 1212 each having the different sheet resistance, and the anti-reflection layer 130 is mostly positioned on the second emitter region 1212 having the sheet resistance greater than the first emitter region 1211. The sheet resistance of the second emitter region 1212 is greater than a sheet resistance (for example, about 50 Ω/sq. to 70 Ω/sq.) of an emitter layer having a general emitter structure in which the sheet resistance of the emitter layer is uniform regardless of a location.

An etch back process may be used to form the emitter layer 121 having the selective emitter structure. For example, n-type impurities or p-type impurities such as phosphor (P) and boron (B) are diffused into the substrate 110 to form the emitter layer, and then the etch back process is performed on the emitter layer to remove a portion of the emitter layer. Hence, the first and second emitter regions 1211 and 1212 each having the different sheet resistance (i.e., the different impurity doping thickness) may be formed.

In this instance, because an impurity doping concentration increases as impurities go to (or are located closer to) the surface of the substrate 110, a concentration of inactive impurities increases as the inactive impurities go to (or are located closer to) the surface of the substrate 110. Accordingly, the inactive impurities are gathered at and around the surface of the substrate 110 and form a dead layer at and around the surface of the substrate 110. Carriers are lost because of the inactive impurities existing at the dead layer. Impurities, which are diffused into the substrate 110 and do not normally combine with (or melt in) the material (for example, silicon) of the substrate 110, are referred to as inactive impurities.

However, in the example embodiment of the invention, at least a portion of the dead layer is removed during the etch back process for forming the emitter layer 121 having the selective emitter structure. As the dead layer is removed, the recombination and/or the disappearance of carriers resulting from the impurities existing at the dead layer is prevented or reduced, and the first anti-reflection layer 131 is positioned on the substrate 110 in which at least the portion of the dead layer is removed. Therefore, the passivation effect performed by the first anti-reflection layer 131 is further improved.

On the other hand, in a solar cell having the general emitter structure in which the emitter layer has the uniform sheet resistance and a uniform impurity doping thickness regardless of a location, when a layer having a double-layered anti-reflection structure including a passivation layer and an anti-reflection layer on the passivation layer is positioned directly on the emitter layer, a satisfactory passivation effect cannot be obtained because of a recombination of carriers resulting from the dead layer existing at the emitter layer. Further, a loss amount of light incident to the inside of the substrate 110 increases because of an increase in a thickness of the layer having the double-layered anti-reflection structure. Hence, the efficiency of the solar cell is reduced.

However, as described above, in the example embodiment of the invention having the selective emitter structure, because the first anti-reflection layer 131 performing the passivation operation is positioned on the second emitter region 1212 in which at least a portion of the dead layer is removed, the passivation effect is greatly improved. Thus, the efficiency of the solar cell is greatly improved in spite of an increase in the thickness of the anti-reflection layer 130 having a double-layered anti-reflection structure including the first and second anti-reflection layers 131 and 132.

Further, in the example embodiment of the invention, because the refractive index of the second anti-reflection layer 132 may be approximately 1.5 to 1.7, a refractive index going from air to the substrate 110 may sequentially vary. In other words, a refractive index of air is approximately 1, and a refractive index of the substrate 110 formed of silicon is approximately 3.5. Therefore, it is preferable, but not required, that each of the first and second anti-reflection layers 131 and 132 has the refractive index between 1 and 3.5. Thus, as described above, the first anti-reflection layer 131 has the refractive index of 2.05 to 2.15.

When a solar cell module is generally manufactured using the plurality of solar cells 1 connected in series or in parallel to one another, the plurality of solar cells 1 are surrounded with a protective material, for example, ethylene vinyl acetate (EVA), so as to protect the plurality of solar cells 1 from moisture or an external impact. In this instance, the protective material may have a refractive index of about 1.45 to 1.5.

Accordingly, the refractive index of the second anti-reflection layer 132 is greater than the refractive index of the protective material positioned on the incident surfaces of the plurality of solar cells 1 and is less than the refractive index of the first anti-reflection layer 131, so that the refractive index going from air to the substrate 110 may sequentially vary. As described above, the refractive index of the second anti-reflection layer 132 may be approximately 1.5 to 1.7.

Accordingly, the gradual changes in the refractive index from air to the substrate 110, more specifically, the refractive indexes of air, the second anti-reflection layer 132, the first anti-reflection layer 131, and the substrate 110 sequentially increase in the order named. As a result, the anti-reflection effect is further improved.

The front electrode part 140 includes a plurality of front electrodes 141 and a plurality of front bus bars 142 connected to the plurality of front electrodes 141.

The plurality of front electrodes 141 are electrically and physically connected to the first emitter region 1211 of the emitter layer 121 and extend substantially parallel to one another in a fixed direction at a distance therebetween. The plurality of front electrodes 141 collect carriers (e.g., electrons) moving to the emitter layer 121.

The plurality of front bus bars 142 are electrically and physically connected to the first emitter region 1211 of the emitter layer 121 and extend substantially parallel to one another in a direction crossing an extending direction of the front electrodes 141.

The front electrodes 141 and the front bus bars 142 are placed on the same level layer (or are coplanar). The front electrodes 141 and the front bus bars 142 are electrically and physically connected to one another at crossings of the front electrodes 141 and the front bus bars 142.

As shown in FIG. 1, the plurality of front electrodes 141 have a stripe shape extending in a transverse or longitudinal direction, and the plurality of front bus bars 142 have a stripe shape extending in a longitudinal or transverse direction. Thus, the front electrode part 140 has a lattice shape on the front surface of the substrate 110.

The plurality of front bus bars 142 collect not only carriers transferred from a portion of the emitter layer 121 contacting the plurality of front bus bars 142 but also the carriers collected by the plurality of front electrodes 141. Because the plurality of front bus bars 142 collect the carriers collected by the plurality of front electrodes 141 and move the carriers to a desired location, a width of each of the plurality of front bus bars 142 is greater than a width of each of the plurality of front electrodes 141.

As the thickness of the emitter layer 121 having the selective emitter structure decreases in the second emitter region 1212, the p-n junction surface between the emitter layer 121 and the substrate 110 moves closer to the surface of the substrate 110. In other words, because a vertical distance between the surface of the substrate 110 and the p-n junction surface between the substrate 110 and the second emitter region 1212 is less than that in the general emitter structure, a moving distance of carriers moving to the front electrode part 140 decreases. Hence, a carrier collection efficiency of the front electrode part 140 is improved, and the efficiency of the solar cell 1 is improved.

Because of the second emitter region 1212, where carriers mostly move to the front electrode part 140, has the impurity doping concentration lower than the first emitter region 1211, a mobility of carriers is improved. Further, because the first emitter region 1211, which contacts the front electrode part 140 and outputs carriers, has the relatively high impurity doping concentration, the first emitter region 1211 has high conductivity and low resistance. Thus, a transfer efficiency of carriers from the first emitter region 1211 to the front electrode part 140 is improved. As a result, the efficiency of the solar cell 1 is improved.

The plurality of front bus bars 142 are connected to an external device and output the carriers (for example, electrons) collected by the front bus bars 142 to the external device.

In the example embodiment of the invention, because the first anti-reflection layer 131 is formed of silicon nitride (SiNx:H) having a characteristic of a positive fixed charge, the carrier transfer efficiency from the substrate 110 to the front electrode part 140 when the substrate 110 is of the p-type is improved. In other words, because the first anti-reflection layer 131 has the positive charge characteristic, the first anti-reflection layer 131 prevents a movement of holes corresponding to positive charges. Thus, the first anti-reflection layer 131 prevents holes from moving to the front surface of the substrate 110, on which the first anti-reflection layer 131 is positioned, and attracts electrons having a negative charge characteristic to the front surface of the substrate 110 (i.e., to the first anti-reflection layer 131). As a result, the transfer efficiency of carrier (for example, electrons) from the substrate 110 to the front electrode part 140 is improved, and an amount of carriers (for example, electrons) output to the front electrode part 140 increases.

The front electrode part 140 including the plurality of front electrodes 141 and the plurality of front bus bars 142 is formed of at least one conductive material, for example, silver (Ag).

Although FIG. 1 shows a predetermined number of front electrodes 141 and a predetermined number of front bus bars 142 on the substrate 110, the number of front electrodes 141 and the number of front bus bars 142 may vary.

The back surface field layer 172 is a region (for example, a $p^+$-type region) that is more heavily doped than the substrate 110 with impurities of the same conductive type as the substrate 110.

A potential barrier is formed by a difference between impurity concentrations of a first conductive region of the substrate 110 and the back surface field layer 172. Hence, the potential barrier prevents or reduces electrons from moving to the back surface field layer 172 used as a moving path of holes and makes it easier for holes to move to the back surface field layer 172. Thus, an amount of carriers lost by a recombination and/or a disappearance of the electrons and the holes at and around the back surface of the substrate 110 is reduced, and a movement of carriers to the back electrode part 150 increases by accelerating a movement of desired carriers (for example, holes).

The back electrode part 150 includes a plurality of back electrodes 151 and a plurality of back bus bars 152 connected to the back electrode 151.

The back electrodes 151 contact the back surface field layer 172 positioned at the back surface of the substrate 110 and are positioned on the entire back surface of the substrate 110 except an edge of the back surface of the substrate 110 and a formation area of the back bus bars 152. The back electrodes 151 contain a conductive material such as aluminum (Al). The back electrodes 151 collect carriers (for example, holes) moving to the back surface field layer 172.

Because the back electrodes 151 contact the back surface field layer 172 having the impurity concentration higher than the substrate 110, a contact resistance between the substrate 110 (i.e., the back surface field layer 172) and the back electrodes 151 decreases. Hence, the carrier transfer efficiency from the substrate 110 to the back electrodes 151 is improved.

The plurality of back bus bars 152 are positioned on the back surface of the substrate 110, on which the back electrodes 151 are not positioned, and are connected to the back electrodes 151. Further, the plurality of back bus bars 152 are positioned opposite the plurality of front bus bars 142 with the substrate 110 therebetween. That is, the back bus bars 152 and the front bus bars 142 may be aligned, but such is not required.

The plurality of back bus bars 152 collect carriers from the back electrodes 151 in the same manner as the plurality of front bus bars 142. The plurality of back bus bars 152 are connected to the external device and output the carriers (for example, holes) collected by the back bus bars 152 to the external device.

The plurality of back bus bars 152 may be formed of a material having better conductivity than the back electrodes 151. Further, the plurality of back bus bars 152 may contain at least one conductive material, for example, silver (Ag).

Alternatively, the back electrodes 151 may be positioned on the entire back surface of the substrate 110. In this instance, the back bus bars 152 may be positioned opposite the front bus bars 142 with the substrate 110 therebetween. The back electrodes 151 may be positioned on the entire back surface of the substrate 110 except the edge of the back surface of the substrate 110, if necessary or desired.

An operation of the solar cell 1 having the above-described structure is described below.

When light irradiated to the solar cell 1 is incident on the emitter layer 121 and the substrate 110 through the second and first anti-reflection layers 132 and 131, a plurality of electron-hole pairs are generated in the emitter layer 121 and the substrate 110 by light energy based on the incident light. In this instance, because a reflection loss of the light incident on the substrate 110 is reduced by the textured surface of the substrate 110 and the second and first anti-reflection layers 132 and 131, an amount of light incident on the substrate 110 further increases.

The electron-hole pairs are separated into electrons and holes by the p-n junction of the substrate 110 and the emitter layer 121, and the separated electrons move to the n-type emitter layer 121 and the separated holes move to the p-type substrate 110. The electrons moving to the n-type emitter layer 121 are collected by the front electrodes 141 and the front bus bars 142 and then move to the front bus bars 142. The holes moving to the p-type substrate 110 are collected by the back electrodes 151 and the back bus bars 152 and then move to the back bus bars 152. When the front bus bars 142 are connected to the back bus bars 152 using electric wires, current flows therein to thereby enable use of the current for electric power.

The following Tables 1 and 2 indicate changes in the efficiency of the solar cell module based on changes in the refractive index and the thickness of each of the first and second anti-reflection layers 131 and 132.

More specifically, in a solar cell module manufactured using a plurality of solar cells each having a selective emitter structure on a single crystal silicon substrate having a textured surface and including an anti-reflection layer of a single-layered anti-reflection structure formed of silicon nitride (SiNx:H), and in a solar cell module manufactured using a plurality of solar cells each having a selective emitter structure on a single crystal silicon substrate having a textured surface and including an anti-reflection layer of a double-layered anti-reflection structure including a first anti-reflection layer formed of silicon nitride (SiNx:H) and a second anti-reflection layer formed of silicon oxide (SiOx:H), when a thickness of each of the anti-reflection layers is changed depending on a refractive index of each of the anti-reflection layers, change in efficiency parameters, for example, a short-circuit current Jsc, an open-circuit voltage Voc, a fill factor FF, and an efficiency Effi measured in each of the solar cell modules are indicated in the following Table 1. In Table 1, the sheet resistance of the first emitter region was approximately 40 Ω/sq. to 45 Ω/sq., and the sheet resistance of the second emitter region was approximately 85 Ω/sq.

efficiency Effi output by the solar cell module was about 17.75% to 17.79% within the thickness range of the first anti-reflection layer between about 65 nm and 85 nm and within the thickness range of the second anti-reflection layer between about 80 nm and 100 nm.

On the other hand, when the refractive indexes of the first and second anti-reflection layers were about 2.05 and about 1.5, respectively and the thicknesses of the first and second anti-reflection layers were about 65 nm and about 60 nm, respectively or the thicknesses of the first and second anti-reflection layers were about 105 nm and about 120 nm, respectively, the efficiency Effi of the solar cell module was about 17.45% to 17.65%. In other words, when the first and second anti-reflection layers were very thin or thick, the efficiency Effi of the solar cell module was greatly reduced.

Further, in the double-layered anti-reflection layer indicated in the above Table 1, when the refractive index of the first anti-reflection layer was about 2.1 and the refractive index of the second anti-reflection layer was about 1.5, the efficiency Effi output by the solar cell module was about 17.74% to 17.81% within the thickness range of the first anti-reflection layer between about 65 nm and 85 nm and within the thickness range of the second anti-reflection layer between about 60 nm and 100 nm.

In the double-layered anti-reflection layer indicated in the above Table 1, when the refractive indexes of the first and second anti-reflection layers were about 2.2 and about 1.5, respectively and the thicknesses of the first and second anti-reflection layers were about 75 nm and about 100 nm, respec-

TABLE 1

| Emitter structure | Anti-reflection layer | | | | Efficiency parameter | | | |
|---|---|---|---|---|---|---|---|---|
| | SiNx: H | | SiOx: H | | | | | |
| | Refractive index | Thickness (nm) | Refractive index | Thickness (nm) | Jsc (mA/cm$^2$) | Voc (V) | FF (%) | Effi (%) |
| Selective Emitter structure | 2.1 | 82 | | | 35.24 | 0.6402 | 78.08 | 17.62 |
| | 2.05 | 65 | 1.5 | 60 | 35.38 | 0.6395 | 77.97 | 17.64 |
| | | | | 80 | 35.49 | 0.6409 | 78.2 | 17.78 |
| | | 85 | | | 35.49 | 0.6422 | 78.05 | 17.79 |
| | | | | 100 | 35.53 | 0.6424 | 77.94 | 17.79 |
| | | 105 | | 120 | 35.45 | 0.6433 | 76.73 | 17.50 |
| | | | | 140 | 35.47 | 0.6438 | 76.39 | 17.44 |
| | 2.1 | 65 | | 60 | 35.48 | 0.6410 | 78.06 | 17.75 |
| | | | | 80 | 35.58 | 0.6421 | 77.95 | 17.81 |
| | | 85 | | | 35.50 | 0.6425 | 77.81 | 17.74 |
| | | | | 100 | 35.55 | 0.6426 | 77.84 | 17.78 |
| | 2.2 | 75 | | | 35.41 | 0.6426 | 77.98 | 17.75 |
| | 2.3 | | | | 34.60 | 0.6412 | 77.88 | 17.28 |

As indicated in the above Table 1, the efficiency parameters output by the solar cell module including the double-layered anti-reflection layer including the first anti-reflection layer formed of silicon nitride (SiNx:H) and the second anti-reflection layer formed of silicon oxide (SiOx:H) was greater than the efficiency parameters output by the solar cell module including the single-layered anti-reflection layer formed of silicon nitride (SiNx:H) having a refractive index of about 2.1 and a thickness of about 82 nm. Hence, the efficiency Effi of the solar cell module including the single-layered anti-reflection layer was about 17.62%, and the efficiency Effi of the solar cell module including the double-layered anti-reflection layer was greater than about 17.62%.

Further, in the double-layered anti-reflection layer indicated in the above Table 1, when the refractive index of the first anti-reflection layer was about 2.05 and the refractive index of the second anti-reflection layer was about 1.5, the tively, the efficiency Effi output by the solar cell module was about 17.75%. Further, when the refractive indexes of the first and second anti-reflection layers were about 2.3 and about 1.5, respectively and the thicknesses of the first and second anti-reflection layers were about 75 nm and about 100 nm, respectively, the efficiency Effi output by the solar cell module was about 17.28%.

The first anti-reflection layer may have the refractive index of about 2.05 to 2.15 and the thickness of about 65 nm to 95 nm and the second anti-reflection layer may have the refractive index of about 1.5 to 1.7 and the thickness of about 80 nm to 110 nm based on the above Table 1 in consideration of the margins of the refractive indexes and the thicknesses of the first and second anti-reflection layers, so as to obtain the solar cell module outputting the efficiency of about 17.7%.

Next, in a solar cell module manufactured using a plurality of solar cells each having a selective emitter structure on a polysilicon substrate, on which a saw damage etching process for removing a damaged portion generated in a slicing process for manufacturing a solar cell substrate in a silicon ingot is performed, and including an anti-reflection layer of a single-layered anti-reflection structure formed of silicon nitride (SiNx:H) and in a solar cell module manufactured using a plurality of solar cells each having the selective emitter structure on the polysilicon substrate, on which the saw damage etching process is performed, and including an anti-reflection layer of a double-layered anti-reflection structure including a first anti-reflection layer formed of silicon nitride (SiNx:H) and a second anti-reflection layer formed of silicon oxide (SiOx:H), when a thickness of each of the anti-reflection layers changed depending on a refractive index of each of the anti-reflection layers, change in efficiency parameters, for example, a short-circuit current Jsc, an open-circuit voltage Voc, a fill factor FF, and an efficiency Effi measured in each of the solar cell modules are indicated in the following Table 2. In Table 2, the sheet resistance of the first emitter region was approximately 40 Ω/sq. to 55 Ω/sq., and the sheet resistance of the second emitter region was approximately 90 Ω/sq.

TABLE 2

| Emitter structure | Anti-reflection layer | | | | Efficiency parameter | | | |
|---|---|---|---|---|---|---|---|---|
| | SiNx: H | | SiOx: H | | | | | |
| | Refractive index | Thickness (nm) | Refractive index | Thickness (nm) | Jsc (mA/cm$^2$) | Voc (V) | FF (%) | Effi (%) |
| Selective Emitter structure | 2.05 | 87 | X | | 32.487 | 0.6238 | 78.35 | 15.88 |
| | | 87 | 1.5 | 100 | 32.908 | 0.6257 | 78.39 | 16.14 |
| | 2.1 | 87 | X | | 32.408 | 0.6242 | 78.32 | 15.84 |
| | | 55 | 1.5 | 60 | 32.759 | 0.6231 | 78.06 | 15.93 |
| | | | | 80 | 33.072 | 0.6225 | 78.24 | 16.11 |
| | | 75 | | 80 | 33.229 | 0.6253 | 78.16 | 16.24 |
| | | | | 100 | 33.262 | 0.6263 | 78.05 | 16.26 |
| | | 2.1/95 | | 140 | 32.395 | 0.6234 | 73.22 | 14.79 |
| | 2.2 | 87 | X | | 31.644 | 0.6228 | 78.35 | 15.44 |
| | | 55 | 1.5 | 60 | 32.686 | 0.6235 | 78.05 | 15.91 |
| | | | | 80 | 32.895 | 0.6203 | 77.82 | 15.88 |
| | | 75 | | 80 | 32.909 | 0.623 | 77.63 | 15.92 |
| | | | | 100 | 33.088 | 0.622 | 77.8 | 16.01 |
| | | 95 | | 140 | 31.934 | 0.6203 | 67.69 | 13.41 |

As indicated in the above Table 2, a change width of the efficiency parameters of the solar cell modules greatly increased depending on changes in the thicknesses of the first and second anti-reflection layers. The efficiency Effi of the solar cell module including the polysilicon substrate was about 13.4% to 16.26%. In other words, the change width (i.e., about 13.4% to 16.26%) of the efficiency Effi of the solar cell module including the polysilicon substrate was much greater than the change width (i.e., about 17.28% to 17.79%) of the efficiency Effi of the solar cell module including the single crystal silicon substrate indicated in the above Table 1. Further, a minimum value of the efficiency Effi of the solar cell module indicated in Table 2 was much less than a minimum value of the efficiency Effi of the solar cell module indicated in Table 1.

Figure 3:
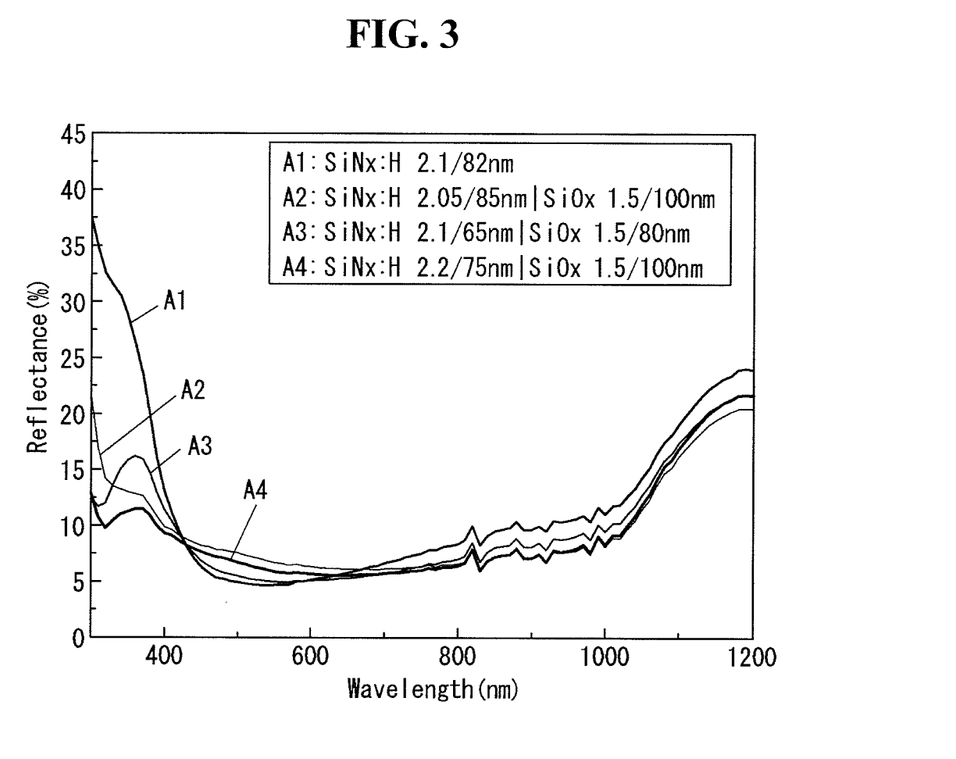
FIG. 3 is a graph illustrating a reflectance of example solar cells at a wavelength depending on changes in a refractive index and a thickness of each of first and second anti-reflection layers.

FIG. 3 is a graph illustrating a reflectance of a solar cell including first and second anti-reflection layers according to some of the examples indicated in the above Table 1.

In FIG. 3, a first graph A1 indicates a reflectance of a solar cell including an anti-reflection layer of a single-layered structure that has a refractive index of about 2.1 and a thickness of about 82 nm and is formed of silicon nitride (SiNx:H); a second graph A2 indicates a reflectance of a solar cell including an anti-reflection layer of a double-layered structure including a first anti-reflection layer, that has a refractive index of about 2.05 and a thickness of about 85 nm and is formed of silicon nitride (SiNx:H), and a second anti-reflection layer, that has a refractive index of about 1.5 and a thickness of about 100 nm and is formed of silicon oxide (SiOx:H); a third graph A3 indicates a reflectance of a solar cell including an anti-reflection layer of a double-layered structure including a first anti-reflection layer, that has a refractive index of about 2.1 and a thickness of about 65 nm and is formed of silicon nitride (SiNx:H), and a second anti-reflection layer, that has a refractive index of about 1.5 and a thickness of about 80 nm and is formed of silicon oxide (SiOx:H); and a fourth graph A4 indicates a reflectance of a solar cell including an anti-reflection layer of a double-layered structure including a first anti-reflection layer, that has a refractive index of about 2.2 and a thickness of about 75 nm and is formed of silicon nitride (SiNx:H), and a second anti-reflection layer, that has a refractive index of about 1.5 and a thickness of about 100 nm and is formed of silicon oxide (SiOx:H).

As indicated by the graph of FIG. 3, the reflectance of the solar cell including the anti-reflection layer of the double-layered structure was less than the reflectance of the solar cell including the anti-reflection layer of the single-layered structure. In particular, the reflectance of the solar cell including the anti-reflection layer of the double-layered structure including the first anti-reflection layer having the refractive index of about 2.05-2.15 and the thickness of about 65-95 nm and the second anti-reflection layer having the refractive index of about 1.5-1.7 and the thickness of about 80-110 nm was greatly reduced with respect to short wavelength light having a wavelength equal to or less than about 450 nm. Hence, in the solar cell according to the example embodiment of the invention, short wavelength light as well as long wavelength light are not reflected to the outside, and the long wavelength light and the short wavelength light are incident on the substrate. As a result, an amount of light on the substrate increases.

Figure 4:
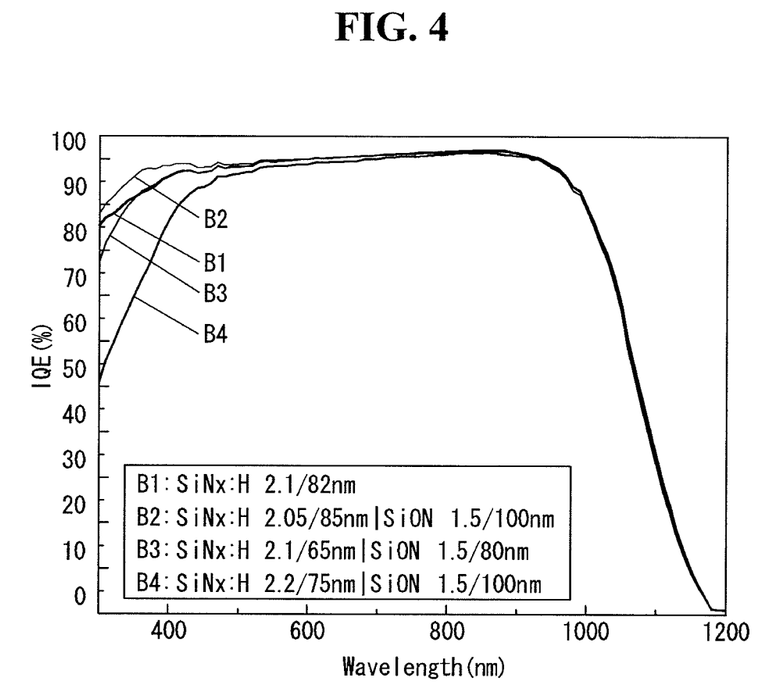
FIG. 4 is a graph illustrating internal quantum efficiency of example solar cells at a wavelength depending on changes in a refractive index and a thickness of each of first and second anti-reflection layers.

FIG. 4 is a graph illustrating internal quantum efficiency (IQE) of each of the four examples illustrated in FIG. 3.

As indicated by the graph of FIG. 4, the internal quantum efficiency of a case B2 where a solar cell includes an anti-reflection layer of a double-layered structure was greater than the internal quantum efficiency of a case B1 where a solar cell includes an anti-reflection layer of a single-layered structure.

Referring to the graph of FIG. 3, the reflectance of the solar cell (i.e., the fourth graph A4) including the anti-reflection layer of the double-layered structure including the first anti-reflection layer having the refractive index of about 2.2 and the thickness of about 75 nm and the second anti-reflection layer having the refractive index of about 1.5 and the thickness of about 100 nm was greatly reduced with respect to short wavelength light. However, referring to the graph of FIG. 4, the internal quantum efficiency of a case B4 having the same configuration as the fourth graph A4 was greatly reduced. The reduction in the internal quantum efficiency is because the refractive index of the first anti-reflection layer was greater than the refractive index range (i.e., about 2.05-2.15) according to the example embodiment of the invention. Namely, because an amount of light absorbed in the first anti-reflection layer formed of silicon nitride (SiNx:H) increased, the internal quantum efficiency was greatly reduced.

Accordingly, the first anti-reflection layer may have the refractive index of about 2.05 to 2.15 and the thickness of about 65 nm to 95 nm and the second anti-reflection layer may have the refractive index of about 1.5 to 1.7 and the thickness of about 80 nm to 110 nm in consideration of the above Tables 1 and 2 and the graphs of FIGS. 3 and 4, so that the efficiency of the solar cell module is equal to or greater than about 17.7%.

As described above, in the solar cell according to the example embodiment of the invention, because the first and second anti-reflection layers are within the refractive index and thickness ranges according to the example embodiment of the invention, the reflectance of the short wavelength light is greatly reduced and the amount of light incident on the substrate increases. Furthermore, because the reduction in the recombination and/or the disappearance of carriers and the increase in the passivation effect are obtained due to the selective emitter structure, the loss amount of carriers is greatly reduced. Furthermore, because the amount of light absorbed in the first anti-reflection layer decreases, the efficiency of the solar cell is improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate of a first conductive type, the semiconductor substrate being a single crystal silicon substrate, and the semiconductor substrate having a textured surface;
an emitter layer of a second conductive type opposite the first conductive type, the emitter layer configured to form a p-n junction along with the semiconductor substrate, having a first part and a second part with different impurity thicknesses, and positioned on a front surface of the semiconductor substrate;
a first anti-reflection layer positioned on the emitter layer, the first anti-reflection layer being formed of silicon nitride, and the first anti-reflection layer having a first refractive index of 2.05 to 2.15 and a first thickness of 65 nm to 95 nm;
a second anti-reflection layer positioned on the first anti-reflection layer, the second anti-reflection layer being formed of silicon oxide, the second anti-reflection layer having a second refractive index of 1.5 to 1.7 and a second thickness of 80 nm to 110 nm;
a first electrode part connected to the emitter layer, and positioned on the first part of the emitter layer; and
a second electrode part connected to a back surface of the semiconductor substrate opposite the front surface of the semiconductor substrate,
wherein the second refractive index is less than the first refractive index, and the second thickness is greater than the first thickness,
wherein a first thickness of the semiconductor substrate where the first part of the emitter layer is overlapped is equal to a second thickness of the semiconductor substrate where the second part of the emitter layer is overlapped,
wherein an impurity doping thickness of the first part of the emitter layer is greater than an impurity doping thickness of the second part of the emitter layer, the impurity doping thickness of the first part of the emitter layer is 400 nm to 700 nm, and the impurity doping thickness of the second part of the emitter layer is 200 nm to 500 nm,
wherein a sheet resistance of the first part of the emitter layer is less than a sheet resistance of the second part of the emitter layer, the sheet resistance of the first part of the emitter layer is 30 $\Omega$/sq. to 70 $\Omega$/sq., and the sheet resistance of the second part of the emitter layer is 80 $\Omega$/sq. to 150 $\Omega$/sq.,
wherein an upper surface of the first part of the emitter layer is projected towards a light incident surface of the substrate,
wherein a lower surface of the first electrode part is in contact with the upper surface of the first part of the emitter layer,
wherein the first anti-reflection layer having a first portion positioned on the first part of the emitter layer and a second portion positioned on the second part of the emitter layer, the first portion of the first anti-reflection layer being formed on the first electrode part and the second portion of the first anti-reflection layer not being formed on the first electrode part,
wherein the first portion of the first anti-reflection layer is located higher than the second portion of the first anti-reflection layer, and
wherein the lower surface of the first electrode part is located higher than an upper surface of the second portion of the first anti-reflection layer.

2. The solar cell of claim 1, wherein the first electrode part adjoins the first part of the emitter layer, and the first anti-reflection layer adjoins the second part of the emitter layer not including a dead layer.

3. The solar cell of claim 2, wherein a first thickness of the emitter layer in the first emitter region is greater than a second thickness of the emitter layer in the second emitter region.

4. The solar cell of claim 2, wherein a shortest distance between a surface of the semiconductor substrate and a p-n junction surface between the first part of the emitter layer and the semiconductor substrate is longer than a shortest distance between the surface of the semiconductor substrate and a p-n junction surface between the second part of the emitter layer and the semiconductor substrate.

* * * * *